United States Patent [19]

Ogawa

[11] Patent Number: 5,017,975
[45] Date of Patent: May 21, 1991

[54] ORGANIC ELECTRONIC DEVICE WITH A MONOMOLECULAR LAYER OR MULTI-MONOMOLECULAR LAYER HAVING ELECTROCONDUCTIVE CONJUGATED BONDS

[75] Inventor: Kazufumi Ogawa, Hirakata, Japan

[73] Assignee: Matsushita Electric Industrial Co., Ltd., Osaka, Japan

[21] Appl. No.: 378,910

[22] Filed: Jul. 12, 1989

[30] Foreign Application Priority Data

Jul. 15, 1988 [JP] Japan ................ 63-177812

[51] Int. Cl.$^5$ ............................................. H01L 29/28
[52] U.S. Cl. ...................................... 357/8; 357/23.7; 431/1
[58] Field of Search ................. 357/8, 23.7; 437/1

[56] References Cited

U.S. PATENT DOCUMENTS

| 4,476,003 | 10/1984 | Frank et al. ................ 204/290 R |
| 4,721,601 | 1/1988 | Wrighton et al. ............... 357/8 X |
| 4,822,566 | 4/1989 | Newman ....................... 324/687 |

FOREIGN PATENT DOCUMENTS

| 58-114465 | 7/1983 | Japan ............................ 357/8 |
| 62-31175 | 2/1987 | Japan ............................ 357/8 |
| 63-76378 | 4/1988 | Japan ........................... 357/237 |
| 64-20207 | 1/1989 | Japan . |
| 120207 | 1/1989 | Japan . |
| 1101313 | 4/1989 | Japan . |
| 1104608 | 4/1989 | Japan . |

OTHER PUBLICATIONS

Report EIM-85-79 by Conference of Elec. Soc., pp. 73-81.

Primary Examiner—Andrew J. James
Assistant Examiner—Sara W. Crane
Attorney, Agent, or Firm—Stevens, Davis, Miller & Mosher

[57] ABSTRACT

The present invention provides an organic electronic device characterized by comprising a monomolecular or built-up multi-monomolecular layer having an insulating layer and an electroconductive conjugated bonds disposed between a first electrode and both a second and a third electrodes formed on a substrate, said device being operated by applying an voltage between said first electrode and said second electrode or said third electrode as well as between said second electrode and said third electrode, varying the voltage between said first electrode and said second electrode or said third electrode to control the electroconductivity of said electroconductive conjugated bonds via said insulating layer, whereby an electric current flowing across said electroconductive conjugated bonds between said second electrode and said third electrode is controlled, where said monomolecular layer is produced by utilizing the LB method or a chemical adsorption technique.

20 Claims, 12 Drawing Sheets

REACTION USING
METAL HALIDE
CATALYST

REACTION USING METAL HALIDE CATALYST

REACTION USING METAL HALIDE CATALYST

POLYMERIZATION USING METAL CATALYST

POLYMERIZATION USING AN ENERGY BEAM IRRADIATION

FIG. 14(a)    FIG. 14(b)    FIG. 14(c)
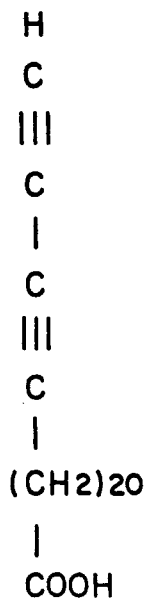
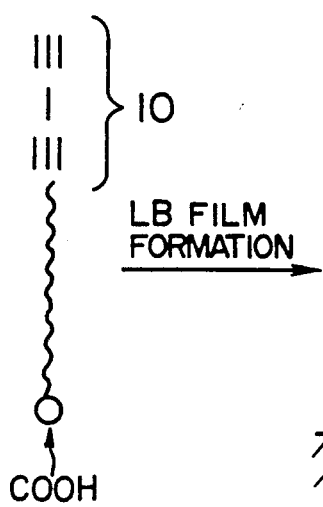
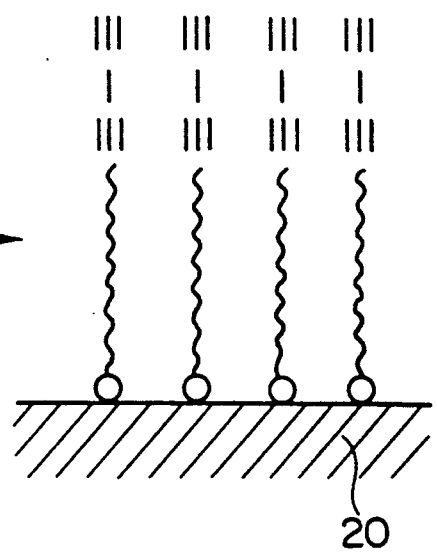
LB FILM FORMATION
POLYMERIZATION USING METAL CATALYST
FIG. 14(d)            FIG. 14(e)
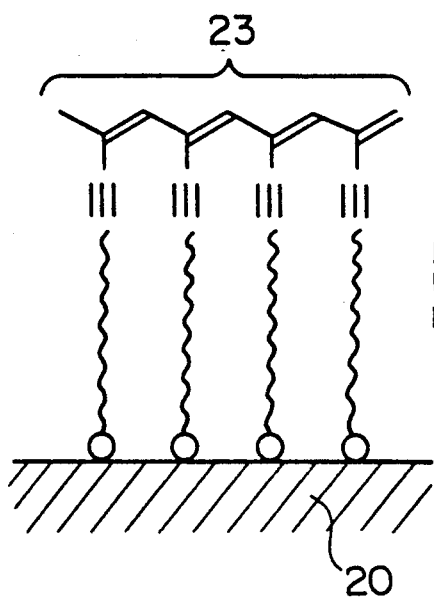
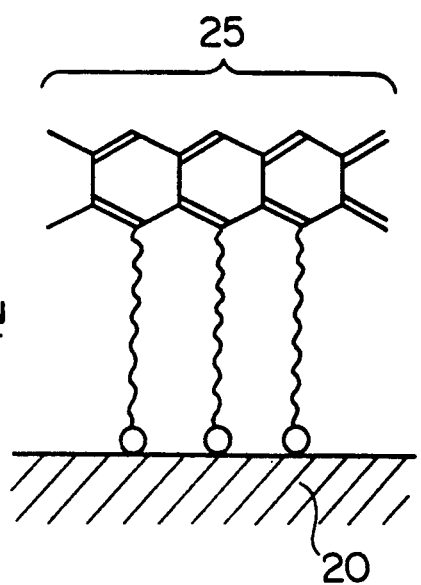
POLYMERIZATION USING AN ENERGY BEAM IRRADIATION

ORGANIC ELECTRONIC DEVICE WITH A MONOMOLECULAR LAYER OR MULTI-MONOMOLECULAR LAYER HAVING ELECTROCONDUCTIVE CONJUGATED BONDS

BACKGROUND OF THE INVENTION

1. Field of the Invention

The present invention relates to an electronic device with organic material (organic device) and a method for producing the same. More particularly, the present invention relates to an electronic device utilizing a current of electrons flowing across an electroconductive monomolecular or electroconductive multi-monomoecular layer and a method for producing the same.

2. Description of Related Art

Electronic devices have been heretofore manufactured by using inorganic semiconductor crystals as represented by silicon crystals. However, the inorganic crystals have disadvantages that as they are made finer, lattice defects become critical and the performance of devices depends greatly upon the crystalinity.

An attempt to manufacture devices with organic semiconductor for the purpose of overcoming such disadvantages has already been described in Report EIM-85-79 by Conference of Elec. Soc.

SUMMARY OF THE INVENTION

It is an object of the present invention to provide a large integration-feasible electronic device by manufacturing the same with organic materials which are independent of the crystalinity even when the finly processing is performed to increase the packing density of the device.

It is another object of the present invention to provide a field effect transistor device capable of operating at a very high speed by utilizing a monomolecular layer or multi-monomolecular layer.

It is still another object of the present invention to provide a high speed transistor device structure suitable for a thin and ultra-fine structure and a process for realizing the same.

The present invention provides an organic electronic device characterized by comprising a monomolecular or built-up multi-monomolecular layer having an insulating layer and an electroconductive group containing conjugated bonds disposed between a first electrode and both a second and a third electrode formed on a substrate by utilizing the Langmuir-Blodgett method or a chemical adsorption process, said device being operated by applying a voltage between said first electrode and said second electrode or said third electrode as well as between said second electrode and said third electrode, varying the voltage between said first electrode and said second electrode or said third electrode to control the electroconductivity of said electroconductive conjugated bonds via said insulating layer, whereby an electric current flowing across said electroconductive conjugated bonds between said second electrode and said third electrode is controlled.

BRIEF DESCRIPTION OF THE DRAWINGS

FIG. 14(a) through FIG. 14(e) are schematic views of a polyacene-type ultra-long conjugated polymer formed on a substrate at respective stages of producing the same.

DETAILED DESCRIPTION OF PREFERRED EMBODIMENTS

Figure 1A:
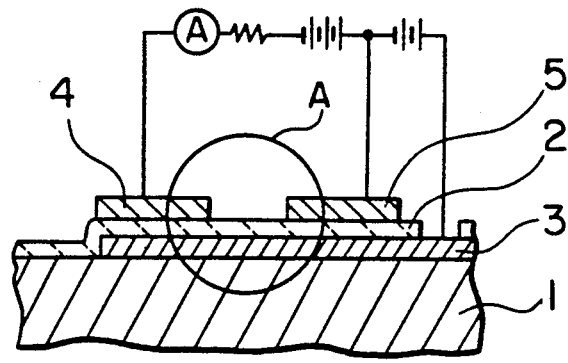
FIG. 1(a) is a schematic cross-sectional view of an embodiment of the organic devices according to the present invention.

First, the present invention will be described with respect to production of an organic monomolecular layer or a built-up multi-monomolecular layer.

By employing, for example, linear hydrocarbon having a terminal

group as material for production of the organic monomolecular layer or the built-up multi-monomolecular layer, such films can be formed on a hydrophilic surface of a substrate by chemical adsorption in a non-aqueous organic solvent (a chemical adsorption process), and the surface of the built up monomolecular layer may be subjected to high energy irradiation in a gas containing oxygen or nitrogen to render the surface hydrophilic. In this way, monomolecular layers can be built-up to form the built-up multi-monomolecular layer.

Thus, the use of materials such as linear hydrocarbon containing an unsaturated group (e.g., acetylenic group) enables production of a monomolecular layer having an unsaturated group on the order of several tens Angstroms by performing the chemical adsorption process. Moreover, a built-up multi-monomolecular layer can be easily obtained.

The unsaturated groups, e.g., acetylenic groups of the monomolecular layer built up by said process are immersed in an organic solvent containing a metal halide catalyst to polymerize the acetylenic groups, whereby a polyacetylene is formed which has an ultra-high molecular weight, a very elongated conjugated segment and is stable even in an atmosphere containing oxygen. Thus, it has been found that the polymerization of the molecules of acetylene derivatives with metallic catalyst while keeping the molecules oriented in one direction enables formation of a linear polymer having an ultra-high molecular weight and a segment containing a sequence of conjugated bonds (ultra-long conjugated polymer).

Alternatively, a material having an unsaturated group such as acetylenic or the like is dissolved in an organic solvent, spread over the surface of the water, and after the organic solvent is evaporated, the molecules of the material remaining on the water are collected by a barrier in the direction parallel to the surface of the water to build up a monomolecular layer on a substrate while the substrate is moved up and down under a predetermined pressure applied to the surface of the water (this process for building up is called as the "Langmuir-Blodgett" and the monomolecular layer built up by this method is referred to as LB film), and thereafter, the substrate having the monomolecular layer built up on the surface thereof is immersed in an organic solvent containing a metal halide catalyst to polymerize the acetylenic groups of the monomolecular layer, whereby a polyacetylene-type polymer is formed which has an ultra-high molecular weight, a very elongated conjugated segment and is stable even in an atmosphere containing oxygen. Thus, it has been found that the polymerization of the molecules have an unsaturated group such as acetylene derivatives or the like enables formation of the linear polymer having an ultra-high molecular weight and a segment containing a very long sequence of conjugated bonds (ultra-long conjugated polymer).

Moreover, it has been found that an ultra-long conjugated polymer having a longer conjugated segment can be produced by applying a DC bias in the direction of the surface of the water when the LB film is built up.

Thus, the present invention enables production of the derives by utilizing the organic materials which are independent of the crystalinity even when the finly processing is performed to increase the packing density of the devices and therefore, makes it possible to manufacture a three terminal organic device capable of operating a higher density of electric signals as compared with existing VLSI.

When the chemical adsorption process is employed for production of the monomolecular layer or the built-up multi-monomolecular layer film, a substrate having a hydrophilic surface is immersed in a solution of a compound having an unsaturated group such as acetylenic group ($C\equiv C$) or the like and a chlorosilyl group

dissolved in a non-aqueous organic solvent to allow the compounds to be chemically adsorbed onto the surface, so that a monomolecular film of the compounds having the unsaturated group and the chlorosilyl group

can be formed on the substrate with the molecules of the compounds being oriented in one direction. Moreover, the chemically adsorbed film having the unsaturated groups built up can be polymerized with metallic catalyst, irradiation, or electric field to produce linear monomolecular polymer having an ultra-high molecular weight and a segment containing a sequence of conjugated bonds. Catalysts which may be used for the polymerization reaction include metal halides such as $MoCl_5$, $WCl_6$, $NbCl_5$, $TaCl_5$, $Mo(CO)_5$, $W(CO)_6$, $Nb(CO)_5$, $Ta(CO)_5$ and the like. Organic solvents which may be used include toluene, dioxane, anisole and the like.

On the other hand, by utilizing the method for producing the LB film, the LB film having the unsaturated groups built up a given substrate after a predetermined presence applied onto the surface of the water can be polymerized with metallic catalyst, irradiation, or electric field to produce linear monomolecular polymer having a ultra-high molecular weight and a segment containing a sequence of conjugated bonds.

In addition, when the molecules containing the unsaturated group are collected on the water by a barrier in the direction parallel to the surface thereof, the application of a DC bias in the direction of the surface improves further improve orientation of the molecules of the monomers at the time of building up and enables a polyacetylene-type polymer having a segment containing a longer sequence of conjugated bonds.

There have been already disclosed methods for producing ultra-thin films having conjugated bonds in molecule as disclosed in our Japanese Patent KOKAI (Laid-Open) Nos. Hei 1-20207, Hei 1-101313, Hei 1-104608, and U.S. patent application Ser. Nos. 07/258,616 and 07/25,619. The present invention is based on the new technique for producing organic devices developed by improving those methods.

Figure 1B:
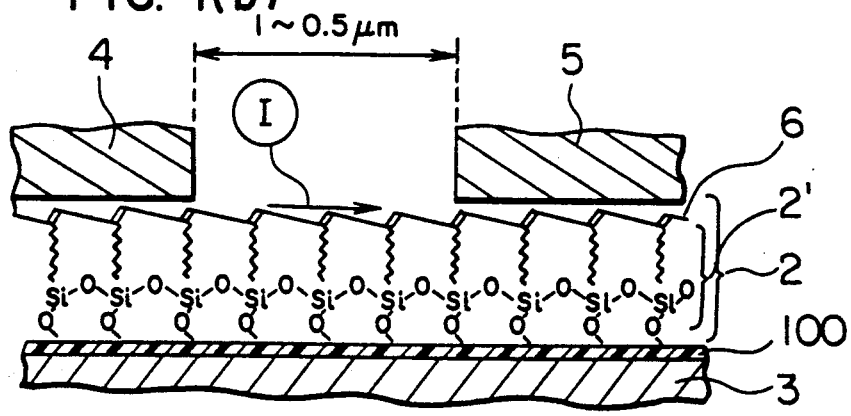
FIG. 1(b) is an enlarged schematic cross-sectional view of the circled part A of the embodiment shown in FIG. 1(a) to show the arrangement of the molecules of an organic monomolecular film.
Figure 2:
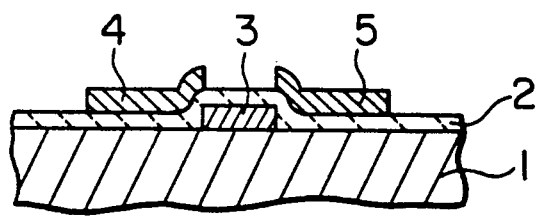
FIG. 2 is a schematic cross-sectional view of another embodiment of the present invention.
Figure 3:
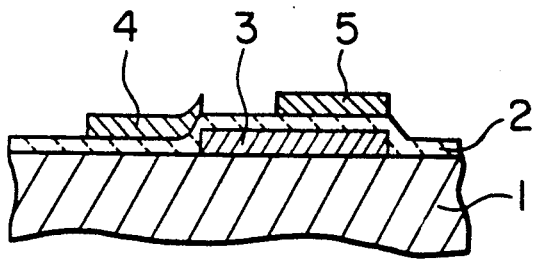
FIG. 3 is a schematic cross-sectional view of still another embodiment of the present invention.

The devices according to the present invention will be described in detail with reference to Examples as shown in FIGS. 1 to 3 hereinunder.

For example, as shown in FIGS. 1(a) and 1(b), there is provided a field effect transistor which have an electroconductive monomolecular or built-up multi-monomolecular layer film containing an insulating layer and electroconductive conjugated bonds 2 disposed between a first metallic electrode 3 (gate electrode) and both a second metallic electrode 4 (source electrode) and a third metallic electrode 5 (drain electrode) formed on a substrate 1. This structure allows the electroconductivity of said electroconductive conjugated bonds to be controlled by applying an voltage between said first electrode and said second electrode or said third electrode as well as between said second electrode and said third electrode, varying the voltage between said first electrode and said second electrode or said third electrode. Since the insulating layer 2' is very thin on the order of several tens Angstroms, an amount of electrons or charges to be injected into the electroconductive conjugated bonds of the electroconductive monomolecular or built-up multi-monomolecular layer can be controlled at an extremely high speed so that an electric current flowing across said electroconductive conjugated bonds between said second electrode and said third electrode can be controlled at a high speed. Therefore, the present invention has an advantage that an extremely high speed organic device can be manufactured.

Referring to FIG. 1(b), reference number 100 designates an oxide film formed on the surface of first electrode. The formation of this oxide layer 100 is preferable for producing layer 2 having Si bonds due to the presence of oxygen. Reference number 6 designates a very thin electroconductive segment of conjugated bonds consisting of polyacetylenic group which becomes a channel area of the field-effect transistor. The current I folwing across the area is controlled. Reference number 2' designates the insulating layer portion which constructs the insulating gate of the transistor together with oxide film 100.

Although this type of devices can be easily produced, it requires the monomolecular or built-up multi-monomolecular layer 2 to be produced with no pinhole because if the monomolecular or built-up multi-monomolecular layer has any pinhole, short circuit is generated between the first metallic electrode and the second or third metallic electrode.

Alternatively, as shown in FIG. 2, there is provided a device which have an electroconductive monomolecular or built-up multi-monomolecular layer disposed between a first metallic electrode 3 and both a second metallic electrode 4 and a third metallic electrodes 5 formed on a substrate in a manner as any part of the second electrode and the third electrode not extending beyond the edges of the first electrode into the region above the latter. In this structure, though pinholes are not critical, it is extremely difficult to positioning the second metallic electrode and the third electrode relative to the first metallic electrode in place. In this case, if the second and the third electrodes overlap greatly the first electrode, the resulting device is the same as that described previously. To the contrary, if the second and the third electrodes are too apart from the first electrode, channel current can not be controlled. Thus, this type if devices requires that the edge lines of the second electrode and the third electrode abut the respective lines right above the respective edges of the first electrode, which makes it difficult to manufacture.

In a most preferable configuration according to the present invention, therefore, there is provided a device as shown in FIG. 3. This device has a monolayer or built-up multi-monomolecular layer disposed between the first electrode and both the second and the third electrodes with at least a part of the second electrode or the third electrode overlapping the first electrode. This type of structure has advantages that the electrodes can be easily positioned in place during manufacturing and the device has a high reliability due to the less overlap of the electrodes.

In order to produce the monomolecular or built-up multi-monomolecular layer, one may employ the LB method or a chemical adsorption technique, as described later. It is required that the monomolecular or built-up multi-monomolecular layer contains electroconductive conjugated bonds such as polyacetylenic group 6 [FIG. 1(b)] as FET channel and that the electroconductive conjugated bonds be in contact with the first electrode.

In order to stabilize the electrical properties, the second and the third electrodes must be disposed in a manner as the gap therebetween is uniform.

Moreover, the second and the third electrodes should be in contact with the electroconductive conjugated bonds of the monomolecular or built-up multi-monomolecular layer to achieve superior electric properties.

Moreover, first electrode 3 should be made of easily oxidizable metals other than Au and Pt to effect an increase of the breakage voltage between the first metallic electrode and the second or third metallic electrode owing to the oxide film 100 spontaneously formed on the surface of the first electrode as shown in FIG. 1(b). The electrode having oxide film 100 spontaneously formed is beneficial for chemical adsorption of the molecular film on the surface thereof.

Electroconductive conjugated bonds which can be useful as channels include polyacetylene, polymethylacetylene, polybutylacetylene, polycyanoacetylene, polydicyanoacetylene, polydiacetylene, polypyridylacetylene, polyphenylacetylene, polyphenylene, polyphenylenevinylene, polythienylene, polypyrrole, polyacene, polypyridinopyridine and polyaniline.

The devices shown in FIGS. 1 through 3 may be modified by forming the second and the third metallic electrodes on the surface of the substrate and then forming the first metallic electrode with the electroconductive monomolecular or built-up multi-monomolecular layer being disposed between the first electrode and the former two electrodes to provide devices having the identical functions as can be naturally understood.

Figure 4A:
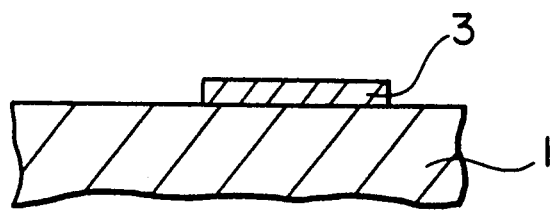
FIG. 4(a) through FIG. 4(c) are schematic cross-sectional views of an embodiment of the organic devices according to the present invention at respective stages of producing the same.
Figure 4B:
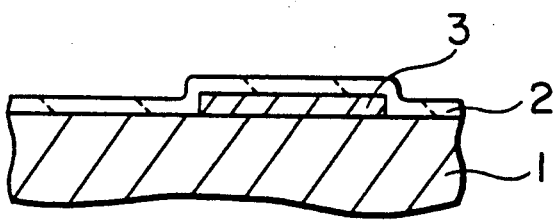
Figure 4C:
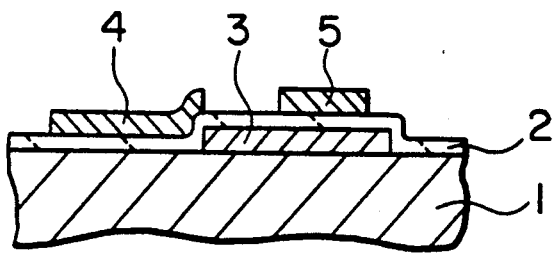

The devices as described above may be manufactured by the following procedure. First, a pattern of first metallic electrode 3 is formed on substrate 1 by any suitable method as shown in FIG. 4 [FIG. 4(a)]. Then, monomolecular or built-up multi-monomolecular layer 2 having electroconductive conjugated bonds is provided on the whole surface of the substrate or at least on the first metallic electrode [FIG. 4(b)]. Processes for producing the monomolecular layers will be disclosed later. Then, second electrode 4 and third electrode 5 are formed on the monomolecular layer [FIG. 4(c)] to obtain an organic device. The metallic electrodes may be formed by utilizing a process where a metal film is deposited by vacuum evaporation onto the surface of the substrate or the monomolecular layer and subjected to etching through a pattern of photoresist or to lift-off so as to leave a pattern of metallic electrode.

The monomolecular layer may be produced by utilizing the LB method or a chemical adsorption technique.

(1) Use of Chemical Adsorption

A wide variety of chemicals could be used. Among them, the use of one of acetylene derivatives, ω-nonadecylinoictrichlorosilane having one terminal acetylenic group 6′ [NCS; CH≡C—(CH$_2$)n—SiCl$_3$ where n is 17, though good results have been obtained in the range of n=14 to 24.] will be explained.

Figure 5A:
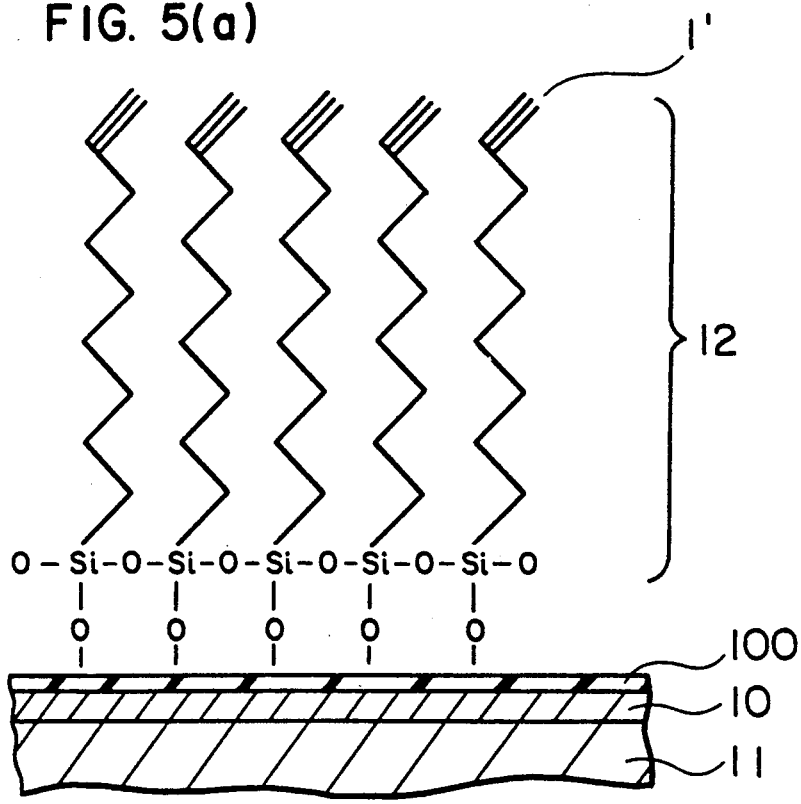
FIG. 5(a) is an enlarged schematic cross-sectional view of a single layer of NCS adsorbed film formed on a substrate to show the arrangement of the molecules of the organic monomolecular film.

For example, as shown in FIG. 5, Al electrode 10 was formed on a Si substrate 11 having SiO$_2$ formed and then monomolecular film 12 is formed by chemical adsorption on the surface of the substrate having the electrode with silane surfactant [NCS; CH≡C—(CH$_2$)$_{17}$—SiCl$_3$]. At this time, the —SiCl group reacts with —OH group produced due to Al$_2$O$_3$ on the surface of the Al electrode to release off hydrochloric acid resulting in formation of a monomolecular CH≡C—(CH$_2$)$_{17}$

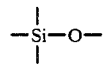

film 12 on the surface of the substrate. For example, in a solution of said silane surfactant at a concentration of $2.0 \times 10^{-3} - 5.0 \times 10^{-3}$ mol/l in a solvent containing 80% n-hexane, 12% tetrachlorocarbon and 8% chloroform was immersed the substrate having Al$_2$O$_3$ electrode for several minutes at room temperature to produce —Si—O— bondings on the surface of the Al$_2$O$_3$ electrode [FIG. 5(a)].

The formation of the monomolecular film 12 of CH≡C—(CH$_2$)$_{17}$

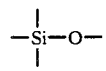

on the surface of the substrate has been confirmed by FTIR.

Figure 5B:
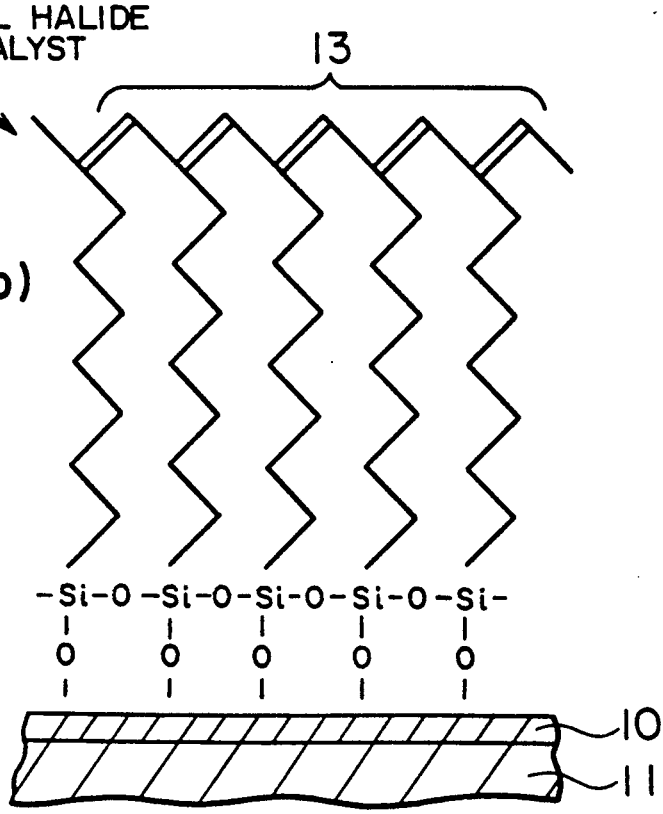
FIG. 5(b) is an enlarged schematic cross-sectional view of trans-type polyacetylene formed on the substrate after polymerization to show the arrangement of the molecules of the polymer.

In this procedure, the formation of the film by chemical adsorption was performed in an atmosphere of N$_2$ containing no moisture. Then, the substrate having a single layer of NCS film adsorbed on the surface thereof was immersed in a solution of MoCl$_6$ as metallic catalyst in toluene and the temperature of the solution was raised to about 30°–70° C. to cause such a raction as producing trans-polyacetylene bonds 3 as shown in FIG. 5(b) which was clearly confirmed by FTIR. The use of WCl$_6$, NbCl$_6$, and TaCl$_5$ as metallic catalysts could produce identical polymer films through the molecular weights thereof were different. Alternatively, the substrate was immersed in a solution of Mo(co)$_6$ of W(CO)$_6$ as catalysts in CCl$_4$ solvent and subjected to ultraviolet irradiation, whereby a purple red colored polymer film could be obtained thought the molecular weight was different.

Figure 6A:
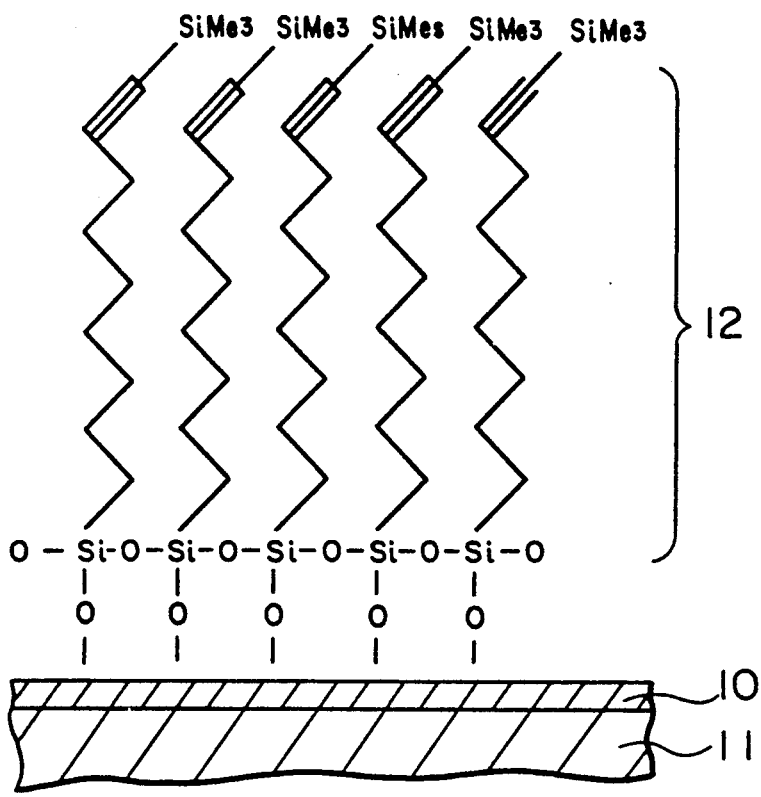
FIG. 6(a) is an enlarged schematic cross-sectional view of a single layer of TMC-NCS adsorbed film formed on a substrate to show the arrangement of the molecules of the organic monomolecular film.
Figure 6B:
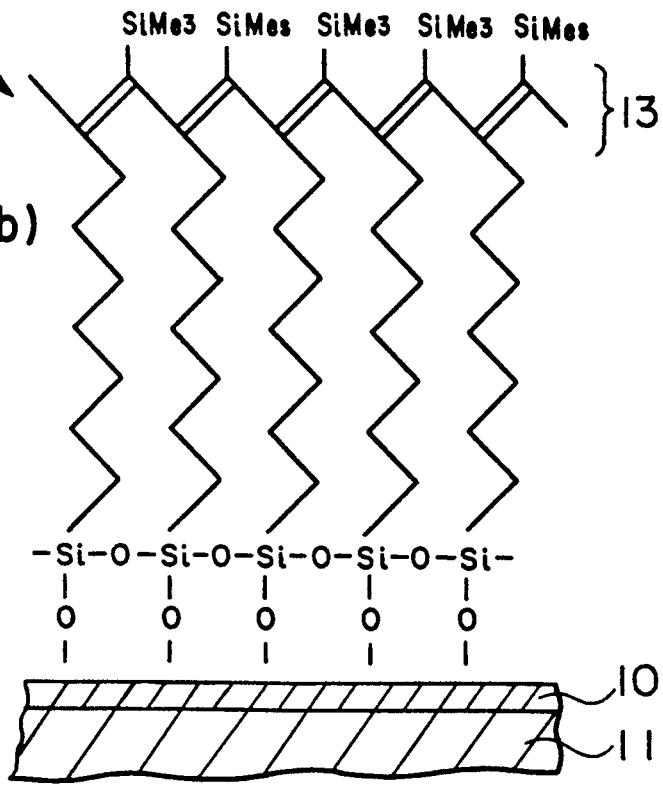
FIG. 6(b) is an enlarged schematic cross-sectional view of trans-type polyacetylene formed on the substrate after polymerization to show the arrangement of the molecules of the polymer.

Alternatively, a Si substrate having a single layer of 1-(trimethylsilyl)-ω-nonadecylinoictrichlorosilane [TMS-NCS; SiMe$_3$—CH≡C—(CH$_2$)n—SiCl$_3$ where n is 17, though good results have been obtained in the range of n=14 to 24.] built up by adsorption [FIG. 6(a)] was immersed in a solution of WCl$_6$ as metallic catalyst and Bu$_4$Sn as cocatalyst (1:1) in toluene and the temperature of the solution was raised to about 30°–70° C. to cause such a raction as producing trans-polyacetylene bonds 13 as shown in FIG. 6(b) which was clearly confirmed.

Figure 7A:
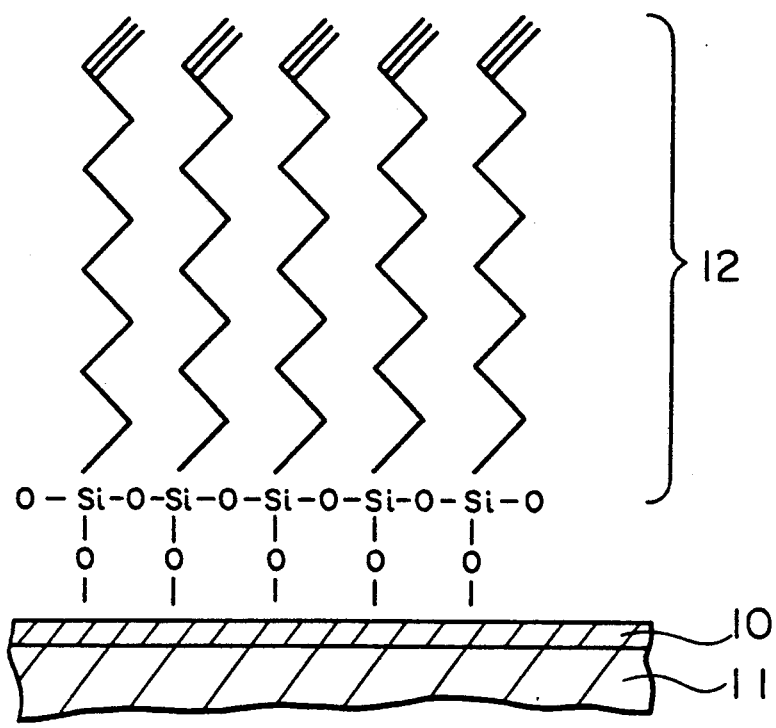
FIG. 7(a) is an enlarged schematic cross-sectional view of a single layer of NCS adsorbed film formed on a substrate to show the arrangement of the molecules of the organic monomolecular film.
Figure 7B:
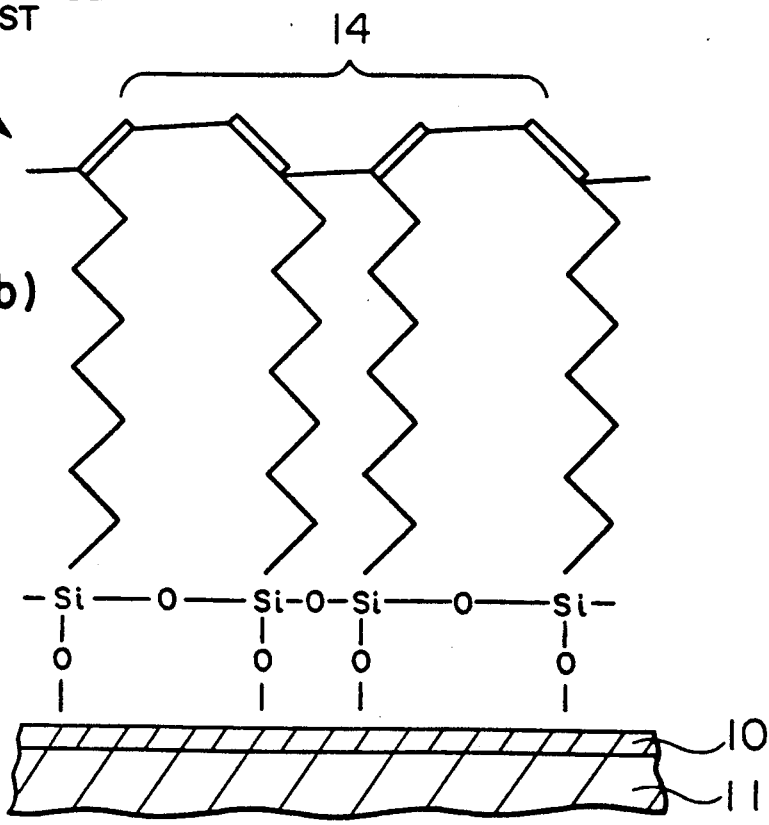
FIG. 7(b) is an enlarged schematic cross-sectional view of cis-type polyacetylene formed on the substrate after polymerization to show the arrangement of the molecules of the polymer.

Alternatively, a Si substrate having a single layer of NCS built-up by adsorption [FIG. 7(a)] is immersed in in a solution of MoCl$_6$ as metallic catalyst in anisole i.e., an organic solvent containing oxygen and the temperature of the solution is raised to about 30°–70° C. to cause such a reaction as producing cis-polyacetylene 14 as shown in FIG. 7(b) which has been clearly confirmed.

Figure 8A:
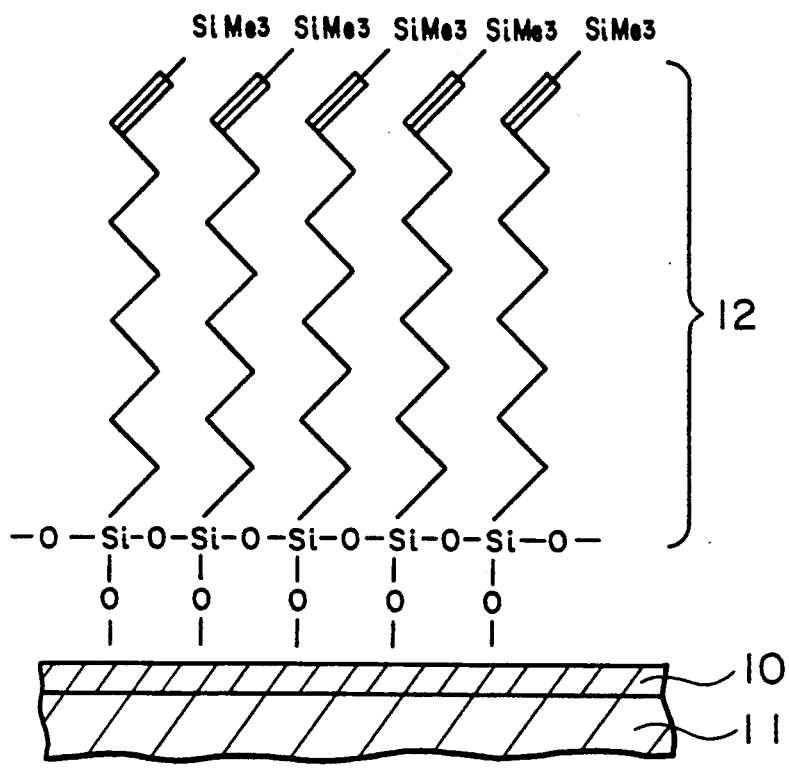
FIG. 8(a) is an enlarged schematic cross-sectional view of a single layer of TMS-NCS adsorbed film formed on a substrate to show the arrangement of the molecules of the organic monomolecular film.
Figure 8B:
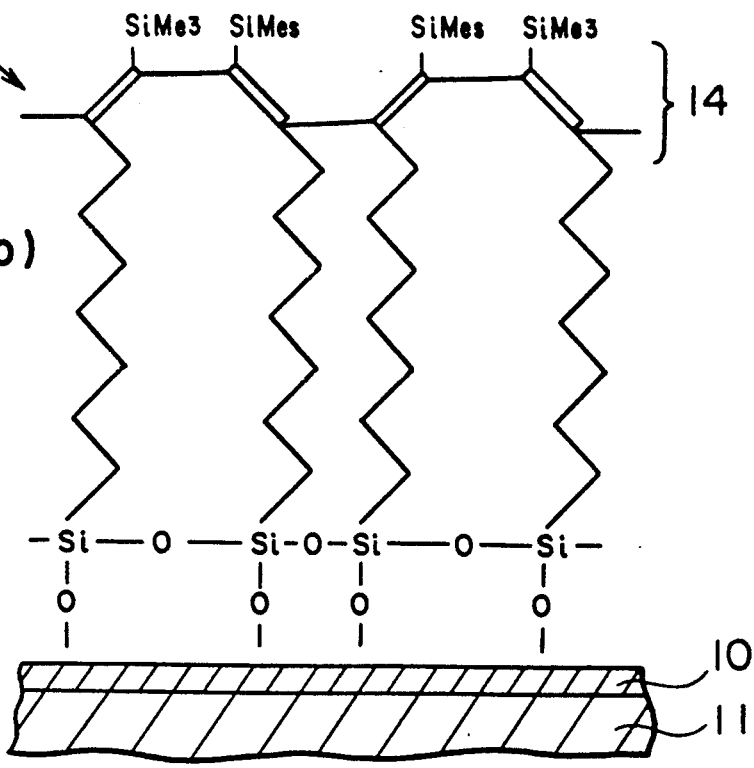
FIG. 8(b) is an enlarged schematic cross-sectional view of cis-type polyacetylene formed on the substrate after polymerization to show the arrangement of the molecules of the polymer.

Alternatively, a Si substrate having a single layer of TMS-NCS built up by adsorption [FIG. 8(a)] is immersed in a solution of MoCl$_6$ as metallic catalyst and ph$_3$Bi as cocatalyst (1:1) in an organic solvent containing oxygen such as anisole and the temperature of the solution is raised to about 30°–70° C. to cause such a raction as producing cis-polyacetylene 14 as shown in FIG. 8(b) which was clearly confirmed.

The LB films built up by the procedures as described above have been confirmed to be insoluble in alcoholic solvents.

In view of the above results, it is recognized that the polimerization according to the present invention can be easily produce monomolecular films containing cis- or trans-type polyacetylene.

The polyacetylene produced as described above was extremely stable against heat, pressure and ultraviolet irradiation even in an atmosphere containing oxygen as compared with conventional polyacetylene derivatives produced by the prior art with Ziegler-Natta catalyst.

Although only NCS and TMS-NCS has been illustrated in Examples as above, it could be understood that those containing acetylenic group (C≡C—) and capable of forming LB films allow the use of similar procedures through adsorption conditions are different.

Figure 9A:
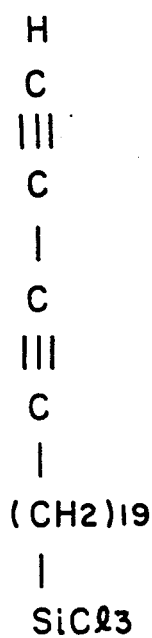
FIG. 9(a) through FIG. 9(e) are schematic views of a polyacene-type ultra-long conjugated polymer formed on a substrate at respective stages of producing the same.
Figure 9B:
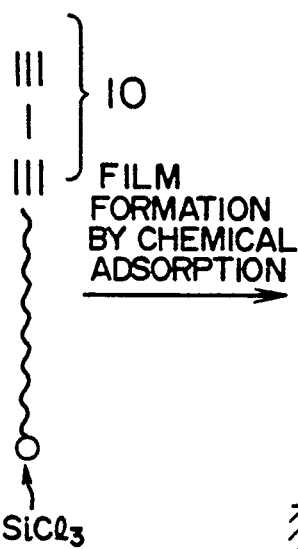
Figure 9C:
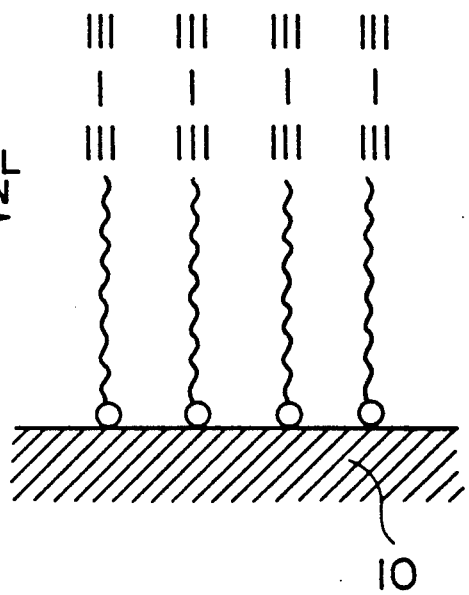

For example, with tricosadyinoictrichlorosilane [H—C≡C—C≡—(CH$_2$)$_{19}$—SiCl$_3$; FIG. 9(a), 9(b)], the monomolecular layer is formed by chemical adsorption [FIG. 9(c)] and polymerized with metallic catalyst to yield the monomolecular polyacetylene-type polymer having ultra-long conjugated polyacetylenic bonds

Figure 9D:
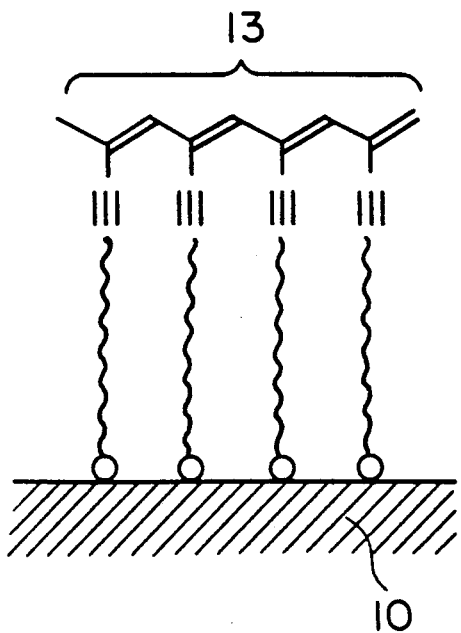
Figure 9E:
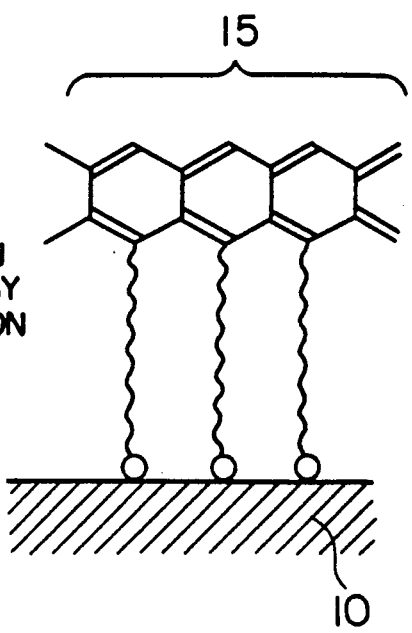

[FIG. 9(d)]. Furthermore, the monomolecular polyacetylene-type polymer having ultra-long conjugated polyacetylenic bonds obtained with polydiacetylene is subjected to electron beam (radiation such as X- or γ-rays may be utilized) to produce a polymer having ultra-long conjugated bonds such as polyacene bonds [FIG. 9(e)].

Other electroconductive conjugated bonds which can be used include polymethylacetylene, polybutylacetylene, polycyanoacetylene, polydicyanoacetylene, polydiacetylene, polypyridylacetylene, polyphenylacetylene, polyphenylene, polyphenylenevinylene, polythienylene, polypyrrole, polypyridinopyridine, polyaniline and the like.

There have been illustrated in the aforementioned Examples procedures where a single monomolecular film is formed by chemical adsorption and then polymerized. Alternatively, however, as can be understood, a number of a number of monomolecular layers may be built-up by chemical adsorption technique and then subjected to polymerization reaction, or a cycle of the formation of an adsorbed film and thereafter the polymerization reaction may be repeated to allow production of the polyacetylene multi-monomolecular layers.

(2) Use of the LB Method

A wide variety of chemicals could be used. Among them, the use of one of acetylene derivatives, ω-tricosynoic acid [TCA; $CH{\equiv}C-(CH_2)n-COOH$ where n is 20, though good results have been obtained with the derivatives of n=14 to 23.] will be explained.

LB films were built up in a clean room class 100 under yellow illumination with lights of 500 nm or less being cut off by using Joyce-Loebl Trough IV. The inside of the room was conditioned at room temperature ob 23°±1° C. and humidity of 40±5%. The substrates used in building up LB films were Si substrates of 3 inches in diameter having oxide film formed. Catalysts which were used for the polymerization reaction include metal halides such as $MoCl_5$, $WCl_6$, $NbCl_5$, $TaCl_5$, $Mo(CO)_5$, $W(CO)_6$, $Nb(CO)_5$, $Ta(CO)_5$ and the like. Organic solvents which can be used include tolene, dioxane, anisole and the like.

Figure 10A:
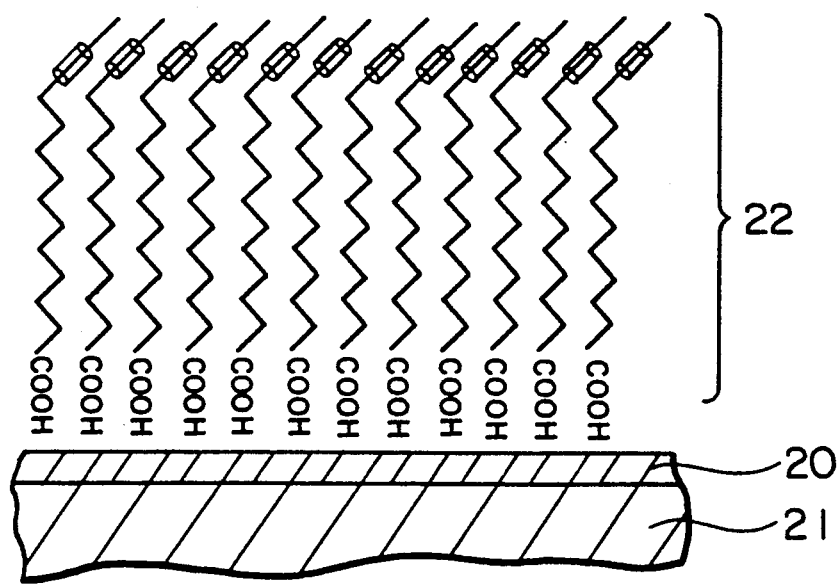
FIG. 10(a) is an enlarged schematic cross-sectional view of a single layer of TCA LB film built up on a substrate to show the arrangement of the molecules of the film.
Figure 10B:
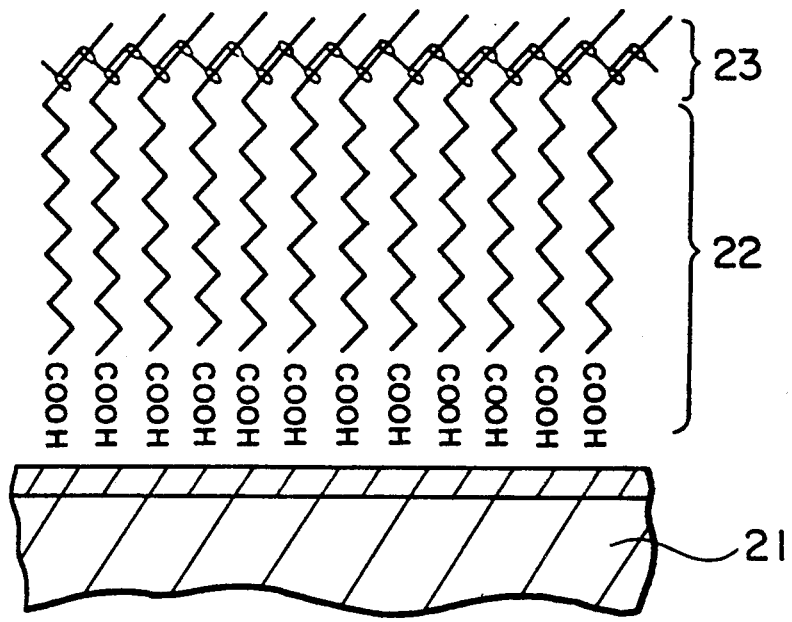
FIG. 10(b) is an enlarged schematic cross-sectional view of trans-type polyacetylene formed on the substrate after polymerization to show the arrangement of the molecules of the polymer.

For example, Ag electrode 20 is formed on a Si substrate 21 having $SiO_2$ formed and then a ω-tricosynoic acid (TCA) LB film is built-up on the surface of the water containing an inorganic salt such as $CaCl_2$ or the like to produce monomolecular layer 22 having the arrangement of molecules as shown in FIG. 10(a). In addition, the substrate having a single layer of ω-tricosynoic acid LB film built-up on the surface thereof was immersed in a solution of $MoCl_6$ as metallic catalyst in toluene and the temperature of the solution was raised to about 30°~70° C. to cause such a raction as producing trans-polyacetylene bonds 23 as shown in FIG. 10(b) which was clearly confirmed by FTIR analysis. The use of $WCl_6$, $NbCl_6$, and $TaCl_5$ as catalysts could produce identical polymer films though the molecular weights thereof were different. Alternatively, the substrate was immersed in a solution of $Mo(co)_6$ or $W(CO)_6$ as catalysts in $CCl_4$ solvent and subjected to ultraviolet irradiation, whereby purple red colored polymer films could be obtained thought the molecular weights thereof was different.

Figure 11A:
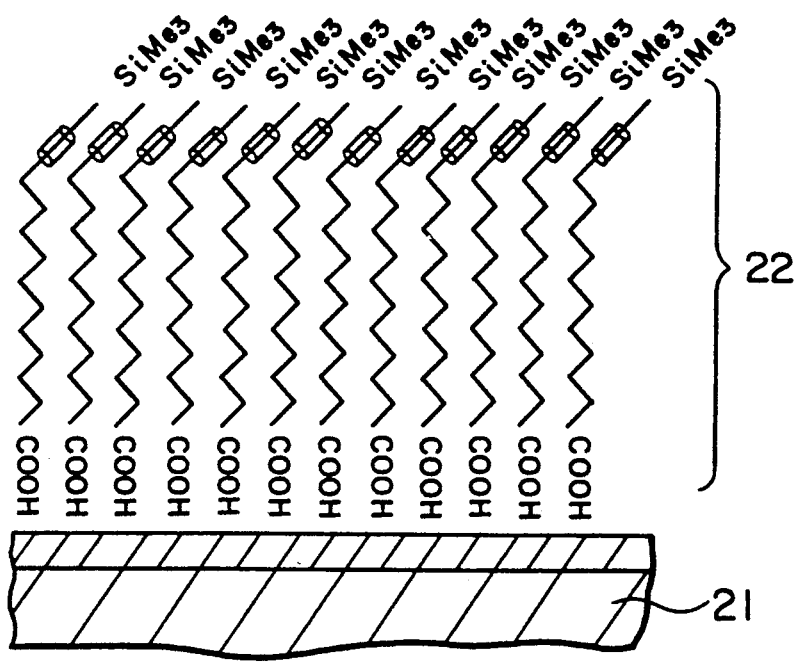
FIG. 11(a) is an enlarged schematic cross-sectional view of a single layer of 1-(trimethylsilyl)-1-tricosanoic acid LB film formed on a substrate to show the arrangement of the molecules of the film.
Figure 11B:
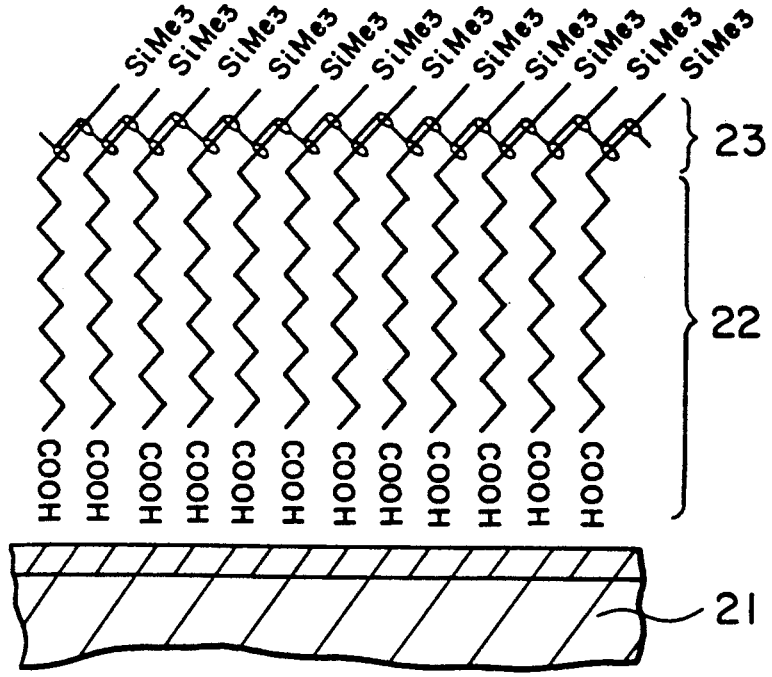
FIG. 11(b) is an enlarged schematic cross-sectional view of trans-type polyacetylene formed on the substrate after polymerization to show the arrangement of the molecules of the polymer.

Alternatively, a Si substrate having a single layer of 1-(trimethylsilyl)-ω-tricosynoic acid [TMS-TCA; $SiMe_3-CH{\equiv}C-(CH_2)n-COOH$ where n is 20, though good results have been obtained with derivatives of n=14 to 23.] LB film built-up [FIG. 11(a)] was immersed in a solution of $WCl_6$ as metallic catalyst and $Bu_4Sn$ as cocatalyst (1:1) in toluene and the temperature of the solution was raised to about 30°-70° C. to cause such a raction as producing trans-polyacetylene bonds 23 as shown in FIG. 11(b) which was clearly confirmed by FRTIR analysis.

Figure 12A:
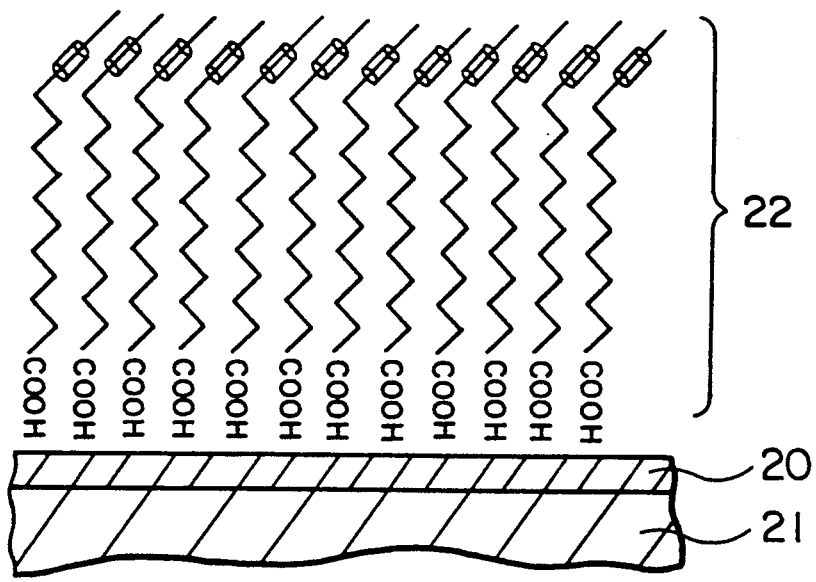
FIG. 12(a) is an enlarged schematic cross-sectional view of a single layer of TCA LB film formed on a substrate to show the arrangement of the molecules of the film.
Figure 12B:
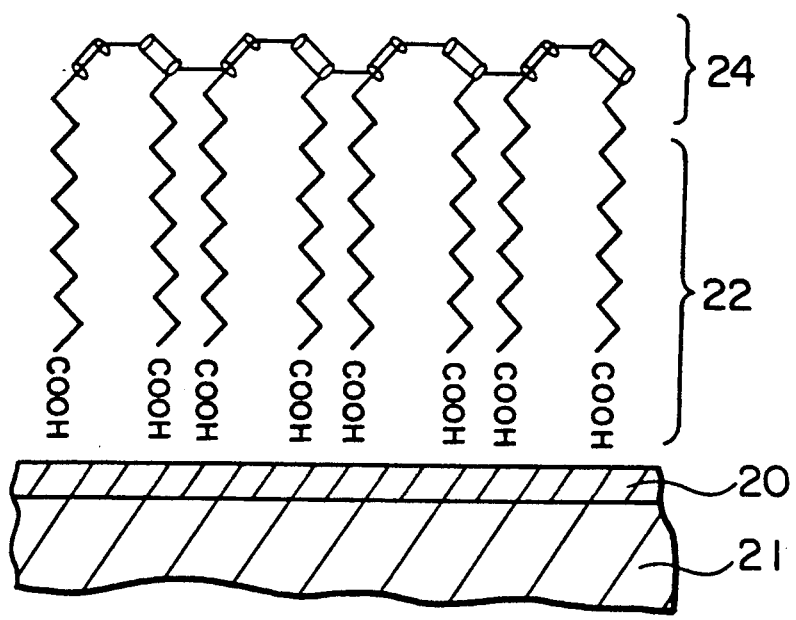
FIG. 12(b) is an enlarged schematic cross-sectional view of cis-type polyacetylene formed on the substrate after polymerization to show the arrangement of the molecules of the polymer.

Alternatively, a Si substrate having a single layer of ω-tricosynoic acid LB film built up [FIG. 12(a)] was immersed in a solution of $MoCl_6$ as metallic catalyst in anisole i.e., an organic solvent containing oxygen and the temperature of the solution was raised to about 30°-70° C. to cause such a raction as producing cis-polyacetylenic bonds 24 as shown in FIG. 12(b) which was clearly confirmed by FRTIR analysis.

Figure 13A:
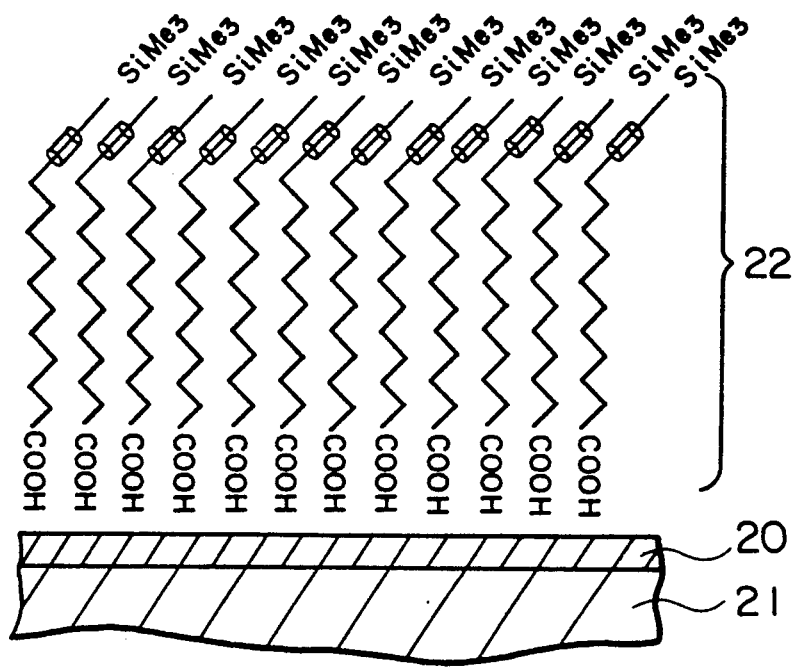
FIG. 13(a) is an enlarged schematic cross-sectional view of a single layer of 1-(trimethylsilyl)-1-tricosanoic acid LB film formed on a substrate to show the arrangement of the molecules of the organic monomolecular film.
Figure 13B:
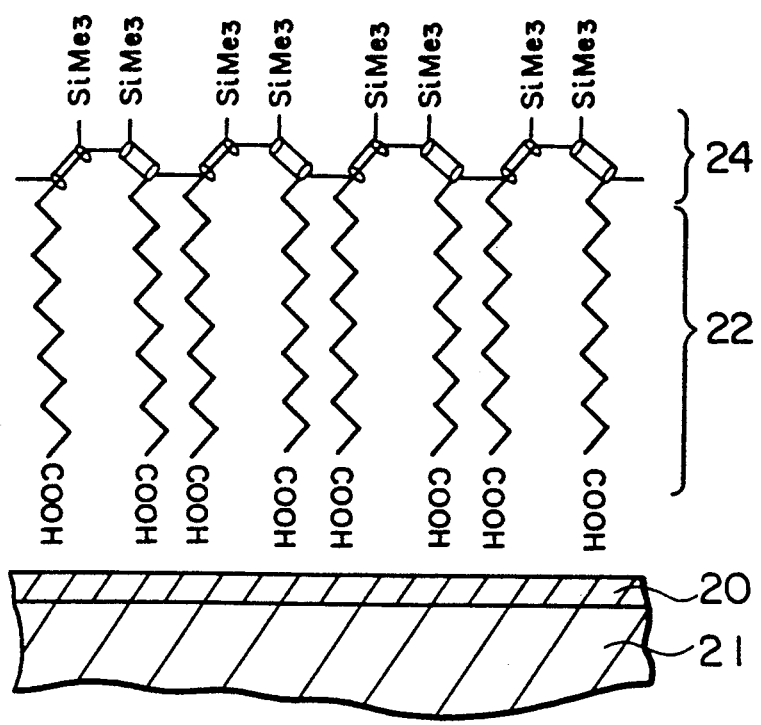
FIG. 13(b) is an enlarged schematic cross-sectional view of cis-type polyacetylene formed on the substrate after polymerization to show the arrangement of the molecules of the polymer.

Alternatively, a Si substrate having a single layer of TMS-TCA LB film built-up Ag electrode 20 [FIG. 13(a)] was immersed in a solution of $MoCl_6$ as metallic catalyst and $ph_3Bi$ as cocatalyst (1:1) in an organic solvent containing oxygen such as anisole and the temperature of the solution was raised to about 30°-70° C. to cause such a raction as producing cis-polyacetylenic bonds 24 containing $-SiMe_3$ group as shown in FIG. 13(b) which was clearly confirmed by FRTIR analysis.

The LB films built up by the procedures as described above have been confirmed to be insoluble in alcoholic solvents.

In view of the above results, it is recognized that the polimerization according to the present invention can be easily produce monomolecular films containing cis- or trans-type polyacetylene.

The polyacetylene produced as described above was extremely stable against heat, pressure and ultraviolet radiation even in an atmosphere containing oxygen as compared with conventional polyacetylene derivatives produced by the prior art with Ziegler-Natta catalyst.

In addition, when the molecules of acetylene derivatives are collected on the water by a barrier in the direction parallel to the surface thereof and built-up, the application of a DC bias of several tens volts in the direction of the surface improves further improve orientation of the molecules of the monomers and enables a polyacetylene-type polymer having a segment containing a longer sequence of conjugated bonds as has been confirmed.

Although only ω-tricosynoic acid and TMS-TCA has been illustrated in Examples as above, it could be understood that those containing acetylenic group ($C{\equiv}C$) and capable of forming LB films allow the use of similar procedures though building up conditions are different.

For example, with pentacosadyinoic acid $[H-C{\equiv}C-C{\equiv}C-(CH_2)_{28}-COOH$; FIG. 14(a)], after the LB film is formed [FIG. 14(c)], the polymerization is performed with metallic catalyst to yield the monomolecular polyacetylene-type polymer having ultra-long conjugated polyacetylenic bonds [FIG. 14(d)]. Furthermore, the polyacetylene-type polymer having ultra-long conjugated polyacetylenic bonds is subjected to electron beam (radiations such as X- or γ-rays may be utilized) to produce ultra-long conjugated bonds such as polyacene bonds 25 [FIG. 14(e)].

There have been illustrated in the aforementioned Examples procedures where a single monomolecular LB film is formed and then polymerized. Alternatively, however, as has been confirmed, a number of monomolecular LB films may be built-up and then subjected to polymerization reaction, or a cycle of the formation of a built-up film and the subsequent polymerization reaction may be repeated to allow production of the multi-monomolecular layer polyacetylene-type polymer films having ultra-long conjugated bonds.

Other electroconductive conjugated bonds which can be used include polymethylacetylene, polybutylacetylene, polycyanoacetylene, polydicyanoacetylene, polydiacetylene, polypyridylacetylene, polyphenylacetylene, polyphenylene, polyphenylenevinylene, polythienylene, polypyrrole, polypyridinopyridine, polyaniline and the like.

The organic devices in accordance with the present invention as described above have signal transferring channels formed with monomolecular conjugated bonds and therefore, are independent of crystlinity even when the high density and high integration of the devices are effected to an extent of molecular order. Therefore, they have an advantage to allow very high packing densification. Moreover, three dimensional packing can be extremely easily performed. Moreover, by using the chemical adsorption processes, polymers having electroconductive conjugated bondings such as polyacetylene group can be efficiently formed on the electrodes so that superior high speed responsive three terminal organic devices capable of operating a very high density of electric signals can be manufactured making positive use of the sequence of conjugated bonds of organic molecules. According to this process, it is possible theoretically to produce linear polyacetylene having an ultra-high molecular weight and a segment containing a sequence of conjugated bonds of several millimeters or several centimeters or more in length. Therefore, it is very useful to manufacture the devices of the present invention. Moreover, with acetylene, diacetylene derivatives and other monomers being used as materials from now on, it would be expected that production of linear stable polyacetylene or polyacene having an ultra-molecular weight and a segment containing a sequence of conjugated bonds of several tens centimeters or several meters or more in length be realized by optimization of the type of materials and production conditions. It would be expected, therefore, that a production of organic superconductive devices requiring no cooling in accordance to this process.

On the other hand, by using the LB method, the polymers having electroconductive conjugated bonds such as polyacetylene group can be efficiently formed on the electrodes so that high performance organic devices can be manufactured. According to this process, it is also possible theoretically to produce linear polyacetylene-type polymers having an ultra-high molecular weight and a segment containing a sequence of conjugated bonds of several millimeters or several centimeters or more in length. Therefore, it is very useful to manufacture the devices of the present invention. Moreover, with acetylene, diacetylene derivatives and other monomers being used as materials from now on, it would be expected that production of linear stable polyacetylene- or polyacene-type polymers having an ultra-high molecular weight and a segment containing a sequence of conjugated bonds of several tens centimeters or several meters or more in length be made possible by optimization of the type of materials and production conditions. There may be, therefore, that a production of organic superconductive devices requiring no cooling be feasible in accordance with this method.

what is claimed is:

1. An organic electronic device characterized by comprising a monomolecular or built-up multi-monomolecular layer having an insulating layer and an electroconductive group containing conjugated bonds disposed between a first electrode and both a second and a third electrode formed on a substrate, said conjugated bonds connecting the second and third electrodes, said device being operated by applying a voltage between said first electrode and said second electrode or said third electrode as well as between said second electrode and said third electrode, varying the voltage between said first electrode and said second electrode of said third electrode to control the electroconductivity of said electroconductive conjugated bonds via said insulating layer, whereby an electric current flowing across said electroconductive conjugated bonds between said second electrode and said third electrode is controlled.

2. Organic electronic device according to claim 1 characterized in that said first electrode and at least a part of said second or third electrode are formed overlapping each other with said monomolecular or built-up multi-monomolecular layer being disposed between therebetween.

3. Organic electronic device according to claim 2 characterized in that said electroconductive conjugated bonds are not in contact with said first electrode.

4. Organic electronic device according to claim 1 characterized in that said first electrode and said third electrode are disposed with uniform spacing apart from each other.

5. Organic electronic device according to claim 1 characterized in that said first electrode is made of a metal having oxide film on the surface thereof.

6. Organic electronic device according to claim 1 characterized in that said electroconductive conjugated bonds are selected from a group consisting of polyacetylene, polymethylacetylene, polybutylacetylene, polycyanoacetylene, polydicyanoacetylene, polydiacetylene, polypyridylacetylene, polyphenylacetylene, polyphenylene, polyphenylenevinylene, polythienylene, polypyrrole, polyacene, polypyridinopyridine and polyaniline.

7. Organic electronic device according to claim 1 characterized in that said monomolecular or built-up multi-monomolecular layer is formed by utilizing the Langmuir-Blodgett method or chemical adsorption technique.

8. An organic electronic device characterized in that a silane surfactant is chemically adsorbed from a non-aqueous organic solvent to form a silicone bond on at least a first electrode formed on a surface of a substrate forming at least one monomolecular layer, said silane surfactant containing an insulating layer and electroconductive conjugated bonds chemically bonded to the surface of said first electrode directly via the silicon atom of said surfactant and a second and a third electrodes being formed on said monomolecular layer in contact with said electroconductive conjugated bonds, said device being operated by applying a voltage between said first electrode and said second electrode or said third electrode as well as between said second electrode and said third electrode, varying the voltage between said first electrode and said second electrode or said third electrode to control the electroconductivity of said electroconductive conjugated bonds via said insulating layer, whereby an electric current flowing across said electroconductive conjugated bonds between said second electrode and said third electrode is controlled.

9. Organic electronic device according to claim 8 characterized in that after at least one layer of said monomolecular film of silane surfactant containing unsaturated groups is formed, said unsaturated groups are boned to produce electroconductive conjugated bonds.

10. Organic electronic device according to claim 8 characterized in that as said silane surfactant, a chemical having a terminal —SiCl group is employed.

11. Organic electronic device according to claim 10 characterized in that as said silane surfactant, a chemical represented by (CH$_3$)$_3$Si—C≡C—(CH$_2$)n—SiCl$_3$ (where n is integer) or HC≡C—C≡C—(CH$_2$)n—SiCl$_3$ (where n is integer) is employed.

12. Organic electronic device according to claim 10 characterized in that in production of said electroconductive conjugated bonds, said substrate having said monomolecular layer built-up is immersed in an second organic solvent containing metal halide catalyst and said unsaturated groups of said monomolecular layer are polymerized.

13. Organic electronic device according to claim 12 characterized in that metal of said metal halide catalyst is Mo, W, Nb, or Ta.

14. Organic electronic device according to claim 12 characterized in that said metal halide catalyst and an organic Sn or Bi.

15. Organic electronic device according to claim 12 characterized in that said unsaturated group is an acetylenyl or diacetylenyl group, said organic solvent is an organic solvent containing oxygen, said metal halide catalyst is MoCl$_5$ and cis-type polyacetylene bondings is produced.

16. Organic electronic device according to claim 9 characterized in that in the step of producing said conjugated bonds, a substrate having a hydrophilic surface is immersed in a non-aqueous organic solvent containing a material having an acetylenic group (—C≡C—) or diacetylenic group (—C≡C—C≡C—) and a group

in solution to form a monomolecular layer of said material by chimical adsorption on said substrate, and said substrate having said monomolecular film built up is immersed in a second organic solvent containing metal halide catalyst to polymerize said acetylenyl groups of said monomolecular layer.

17. An organic electronic device characterized in that surfactant containing a double or triple bond group is spread on the water in a cell to form a monomolecular layer, said monomolecular layer is transferred at least one onto at least a first electrode on the surface of a substrate, chemically reacting said surfactant in the monomolecular layer to produce an insulating layer and electroconductive conjugated bonds, and forming a second electrode and a third electrode on said monomolecular layer in contact with said electroconductive conjugated bonds, said device being operated by applying a voltage between said first electrode and said second electrode or said third electrode as well as between said second electrode and said third electrode, varying the voltage between said first electrode and said second electrode or said third electrode to control the electroconductivity of said electroconductive conjugated bonds via said insulating layer, whereby an electric current flowing across said electroconductive conjugated bonds between said second electrode and said third electrode is controlled.

18. Organic electronic device according to claim 17 characterized in that a material having an acetylenic (—C≡C—) group as an unsaturated group is used, said material dissolved in an organic solvent is spread over the surface of the water, and after the organic solvent is evaporated, the molecules of said material containing said acetylenic group remaining on the water are collected by a barrier in the direction parallel to the plane of the surface of the water, a monomolecular layer is formed on the surface of the water under a predetermined pressure applied to the surface, said monomolecular layer is built-up on said substrate while said substrate is moved up and down under a predetermined pressure applied to the surface of the water, and said substrate having said monomolecular layer built-up on the surface thereof is immersed in an organic solvent containing a metal halide catalyst to polymerize said acetylenyl groups of said monomolecular layer.

19. Organic electronic device according to claim 18 characterized in that said building up is conducted with a DC field being applied in the direction parallel to the surface of the water at the same time of applying said predetermined pressure.

20. Organic electronic device according to claim 18 or claim 19 characterized in that said organic solvent is an organic solvent containing oxygen, said metal halide catalyst is MoCl$_5$ and cis-type polyacetylene ultra-long conjugated bonds is produced.

* * * * *